(12) United States Patent
Kim et al.

(10) Patent No.: US 7,936,044 B2
(45) Date of Patent: May 3, 2011

(54) NON-VOLATILE MEMORY DEVICES AND METHODS OF FABRICATING THE SAME

(75) Inventors: Dong Chul Kim, Suwon-si (KR); In-kyeong Yoo, Suwon-si (KR); Myoung-jae Lee, Suwon-si (KR); Sun-ae Seo, Hwaseong-si (KR); In-gyu Baek, Seoul (KR); Seung-eon Ahn, Seoul (KR); Byoung-ho Park, Yongin-si (KR); Young-kwan Cha, Yongin-si (KR); Sang-jin Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 447 days.

(21) Appl. No.: 11/403,902

(22) Filed: Apr. 14, 2006

(65) Prior Publication Data
US 2007/0120580 A1 May 31, 2007

(30) Foreign Application Priority Data
Nov. 11, 2005 (KR) .................. 10-2005-0108125

(51) Int. Cl.
*H01L 29/00* (2006.01)

(52) U.S. Cl. .............. 257/529; 438/142; 438/3; 438/93; 257/2; 257/E21.086; 257/E43.001; 257/E31.029

(58) Field of Classification Search ............ 365/99–105; 257/529, 2, 209, 295, E21.086, E43.001, 257/E31.029, E27.104; 438/142, 3, 93
See application file for complete search history.

(56) References Cited

U.S. PATENT DOCUMENTS

| | | | |
|---|---|---|---|
| 5,854,104 A * | 12/1998 | Onishi et al. | 438/396 |
| 6,376,325 B1 * | 4/2002 | Koo | 438/396 |
| 6,635,497 B2 * | 10/2003 | Aggarwal et al. | 438/3 |
| 6,849,891 B1 * | 2/2005 | Hsu et al. | 257/296 |
| 2004/0159868 A1 | 8/2004 | Rinerson et al. | |
| 2004/0180453 A1 * | 9/2004 | Kim et al. | 438/3 |
| 2005/0006643 A1 | 1/2005 | Lan et al. | |

(Continued)

FOREIGN PATENT DOCUMENTS
EP  1 484 799 A2  12/2004

OTHER PUBLICATIONS

European Office Action (dated Feb. 21, 2008) for counterpart European Patent Application No. SKG/G28834EP is provided for the purpose of certification under 37 C.F.R. § 1.97(e).

(Continued)

*Primary Examiner* — Hoai v Pham
*Assistant Examiner* — Elias Ullah
(74) *Attorney, Agent, or Firm* — Harness, Dickey & Pierce, P.L.C.

(57) ABSTRACT

A memory device may include a switching device and a storage node coupled with the switching device. The storage node may include a first electrode, a second electrode, a data storage layer and at least one contact layer. The data storage layer may be disposed between the first electrode and the second electrode and may include a transition metal oxide or aluminum oxide. The at least one contact layer may be disposed at least one of above or below the data storage layer and may include a conductive metal oxide.

26 Claims, 10 Drawing Sheets

U.S. PATENT DOCUMENTS

2005/0247921 A1 11/2005 Lee et al.
2006/0108625 A1 5/2006 Lee et al.

OTHER PUBLICATIONS

S. Seo et al., "Reproducible resistance switching in polycrystalline NiO films," Applied Physics Letters, American Institute of Physics, Melville, NY, vol. 85, No. 23, pp. 5655-5657, Dec. 6, 2004.

N. Fuschillio et al., "Non-Linear Transport and Switching Properties of Transition Metal Oxides," Japanese Journal of Applied Physics, Japan Society of Applied Physics, Tokyo, JP, vol. 2, No. 1, 1974, pp. 817-820.

Office Action for corresponding Chinese Patent Application No. 200610075345.9 mailed May 8, 2009.

Office Action for corresponding Chinese Patent Application No. 200610075345.9 mailed Jul. 30, 2010.

* cited by examiner

NON-VOLATILE MEMORY DEVICES AND METHODS OF FABRICATING THE SAME

PRIORITY STATEMENT

This non-provisional application claims priority under 35 U.S.C. §119 to Korean Patent Application No. 10-2005-0108125, filed on Nov. 11, 2005, in the Korean Intellectual Property Office (KIPO), the entire contents of which are incorporated herein by reference.

BACKGROUND OF THE INVENTION

1. Field of the Invention

Example embodiments of the present invention relate to non-volatile memory devices that may use resistance material. For example, at least some example embodiments of the present invention may be directed to non-volatile memory devices with an improved structure providing more stable memory switching characteristics in a storage node and fabrication methods thereof.

2. Description of the Conventional Art

Conventional non-volatile memory devices using a conventional resistance material may include ferroelectric random access memory (FRAM), magnetoresistive RAM (MRAM) and phase-change RAM (PRAM). While dynamic RAM (DRAM) and flash memories store binary information using charges, FRAM, MRAM and PRAM store binary information using a polarization characteristic of a ferroelectric material, a resistance change of a magnetic tunnel junction (MTJ) according to a magnetized state of a strong magnetic material, and a resistance change due to a phase change, respectively. The FRAM, MRAM and PRAM may be integrated on a larger scale similar to DRAM and may be non-volatile similar to flash memories. Therefore, FRAM, MRAM and PRAM may be used in replacing conventional volatile or non-volatile memories.

PRAM will be described as an example non-volatile memory device. PRAM may retrieve binary information using a certain characteristic of a phase-change material such as GeSbTe (GST). This example phase-change material changes its phase into a crystalline or amorphous state by heat generated regionally when an electric pulse is applied to the phase-change material. In PRAM, a memory cell storing binary information may include a phase-change layer, a resistor and a switch transistor. The phase-change layer may be a GST-based material, for example, a material referred to as chalcogenide. The resistor may be used to heat the phase-change layer. Depending on a degree of heat, a resistance value may vary because the phase-change layer changes phase into a crystalline or amorphous state. Current flowing into the resistor may cause a voltage level to vary, and the variable voltage level may allow for PRAM to store and read binary information.

FIG. 1 is a cross-sectional view briefly illustrating a conventional non-volatile memory device. FIG. 2 is a graph illustrating a switching characteristic of a storage node illustrated in FIG. 1. FIG. 3A is a graph illustrating a distribution of set and reset voltage values applied to the storage node illustrated in FIG. 1. FIG. 3B is a graph illustrating a distribution of resistance values of the storage node depending on an on or off state.

Referring to FIG. 1, the conventional non-volatile memory device using a thin NiO layer may include a transistor 20 and a storage node 28 coupled with the transistor 20. The transistor 20 may include a source 12S, a drain 12D, a channel 12C, an insulating layer 13 and a gate electrode 14. The storage node 28 may include an upper electrode 26, a lower electrode 24 and a thin NiO layer 25 disposed there between. An insulation layer 30 may be disposed between the storage node 28 and the transistor 20. The storage node 28 may be coupled with the transistor 20 through a conductive contact plug 22, and a plate electrode 32 may be formed over the upper electrode 26.

The storage node 28 of the conventional non-volatile memory device may have an M-I-M memory cell structure. Herein, 'M' represents metal-based upper and lower electrodes, and 'I' represents a NiO layer, which is a resistance material. In a conventional resistance material implemented memory device having the M-I-M memory cell structure, set voltage values $V_{set}$ and reset voltage values $V_{reset}$ applied to a storage node during repetitive switchings may be distributed with larger deviation. During repetitive switchings, the storage node may have non-uniform resistance values $R_{ON}$ and $R_{OFF}$ depending on an on or off state.

As a result, memory switching characteristics may be unstable in conventional non-volatile memory devices.

SUMMARY OF THE INVENTION

At least some example embodiments of the present invention provide non-volatile memory devices with an improved structure and/or more stable memory switching characteristics in a storage node, and fabrication methods thereof.

According to an example embodiment of the present invention, a non-volatile memory device may include a switching device and a storage node coupled with the switching device. The storage node may include a first electrode; a second electrode, a data storage layer disposed between the first electrode and the second electrode and at least one contact layer. The data storage layer may include a transition metal oxide or aluminum oxide. The at least one contact layer may be arranged between the first electrode and the data storage layer and/or between the data storage layer and the second electrode. The at least one contact layer may include a conductive metal oxide. The conductive metal oxide may improve interfacial characteristics between the data storage layer and the first electrode and/or between the data storage layer and the second electrode.

The conductive metal oxide may be comprised of $IrO_2$, $RuO_2$, $SrRuO_3$, $MoO_2$, $OsO_2$, $ReO_2$, $RhO_2$, $WO_2$ and/or indium tin oxide (ITO). The at least one contact layer may have a thickness ranging from approximately 10 Å to approximately 500 Å. The transition metal oxide may be an oxide of a metal such as Ni, Nb, Ti, Zr, Hf, Co, Fe, Cu and/or Cr. Each of the first electrode and the second electrode may be formed of a material such as Ir, Pt, Ru, W, TiN and/or polysilicon. The switching device may be a transistor or a diode. The at least one contact layer may include a single contact layer arranged between the first electrode and the data storage layer, a single electrode arranged between the data storage layer and the second electrode or a first and a second contact layer. If the at least one contact layer includes a first and a second contact layer, the first contact layer may be arranged between the first electrode and the data storage layer and the second contact layer may be arranged between the data storage layer and the second electrode.

According to another example embodiment of the present invention a method of fabricating a non-volatile memory device may include preparing a switching device, forming a first electrode coupled with the switching device, forming a first contact layer over the first electrode, forming a data storage layer formed over the first contact layer, and forming a second electrode over the data storage layer. The first contact layer may include a conductive metal oxide, and the data storage layer may include a transition metal oxide or aluminum oxide.

In at least some example embodiments of the present invention, a second contact layer may be formed on the data storage layer using a conductive metal oxide after forming the data storage layer and before forming the second electrode.

According to another example embodiment of the present invention, a method of fabricating a non-volatile memory device may include preparing a switching device, forming a first electrode coupled with the switching device, forming a data storage layer over the first electrode, forming a contact layer over the data storage layer and forming a second electrode over the contact layer. The data storage layer may include a transition metal oxide or aluminum oxide, and the contact layer may include a conductive metal oxide The conductive metal oxide may be one of $IrO_2$, $RuO_2$, $SrRuO_3$, $MoO_2$, $OsO_2$, $ReO_2$, $RhO_2$, $WO_2$, and ITO (indium tin oxide). The contact layer may be formed to a thickness ranging from approximately 10 Å to approximately 500 Å. The transition metal oxide may be an oxide of a metal selected from the group consisting of Ni, Nb, Ti, Zr, Hf, Co, Fe, Cu, and Cr. Each of the first electrode and the second electrode may be formed of a material selected from the group consisting of Ir, Pt, Ru, W, TiN, and polysilicon. The switching device may be a transistor or a diode.

According to example embodiments of the present invention, the non-volatile memory device may be implemented with an improved structure, which provides a more stable switching characteristic in the storage node.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE PRESENT INVENTION

Figure 1:
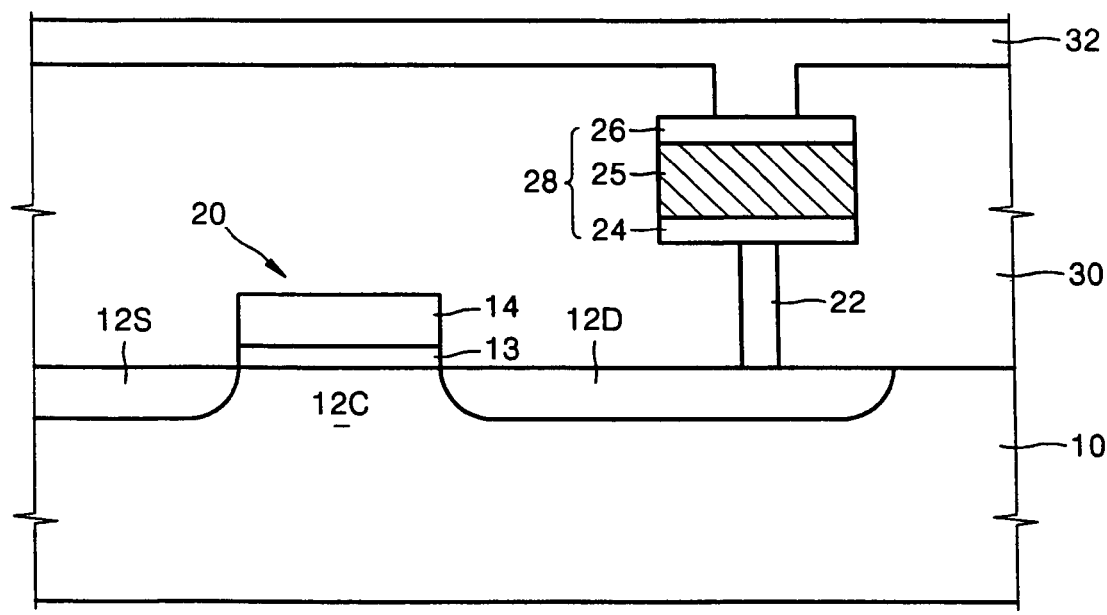
FIG. 1 is a cross-sectional view briefly illustrating a conventional non-volatile memory device.
Figure 2:
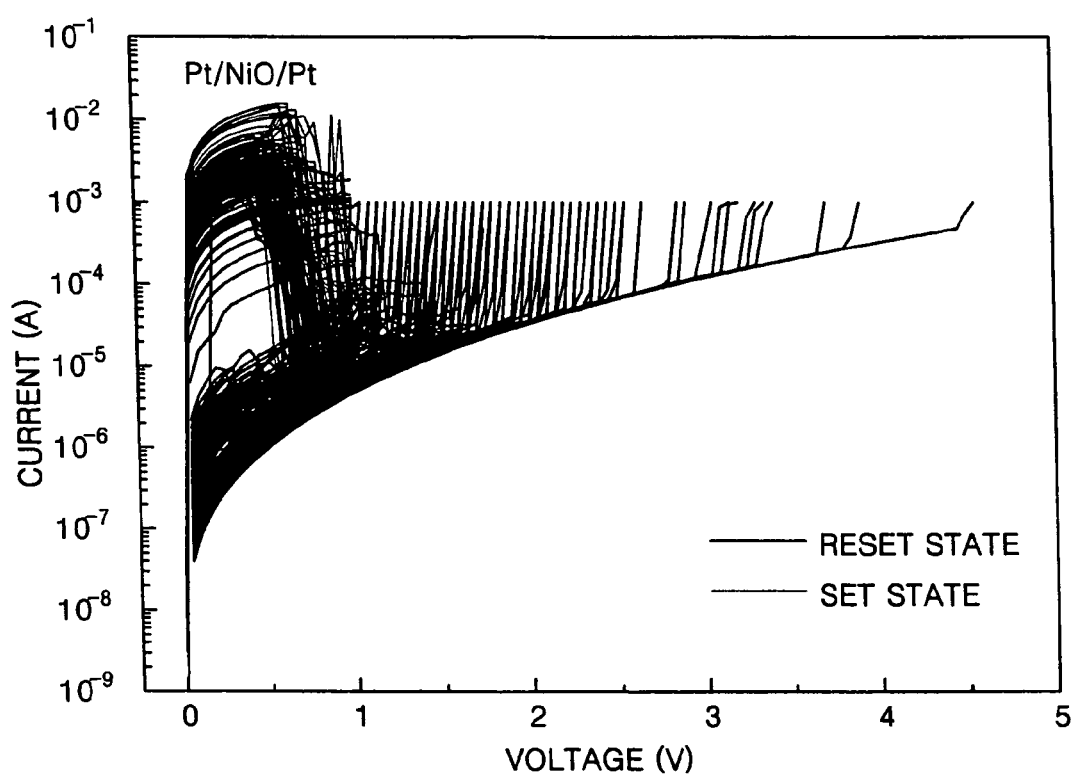
FIG. 2 is a graph illustrating a switching characteristic of a storage node illustrated in FIG. 1.
Figure 3A:
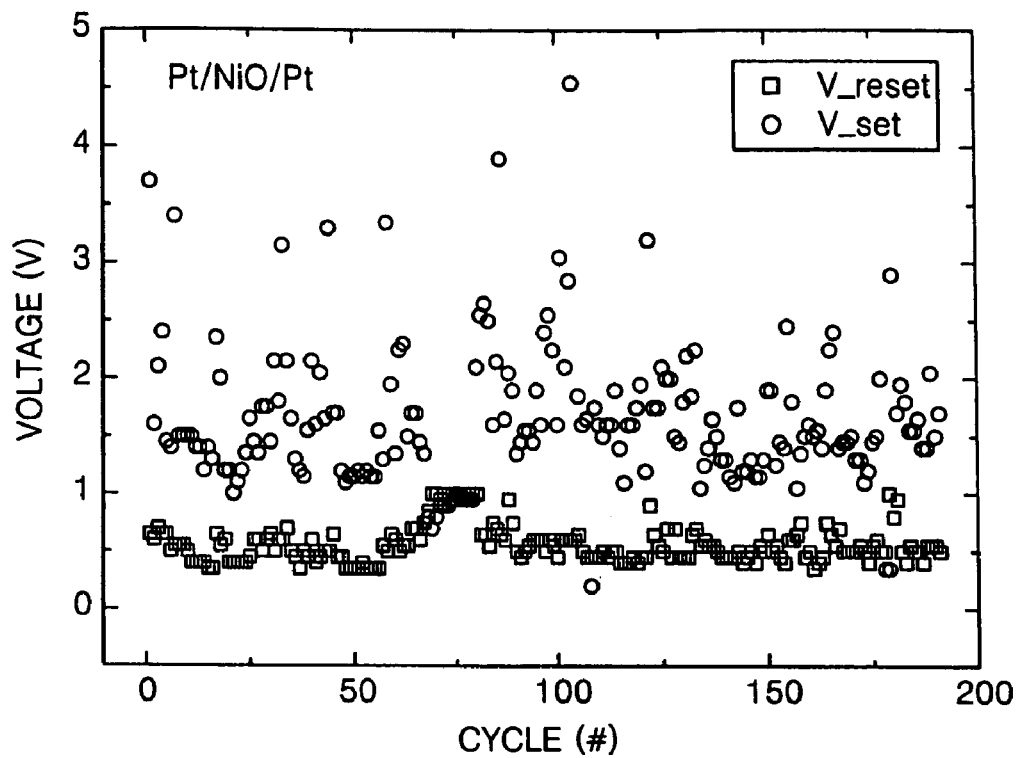
FIG. 3A is a graph illustrating a distribution of set and reset voltage values applied to the storage node illustrated in FIG. 1.
Figure 3B:
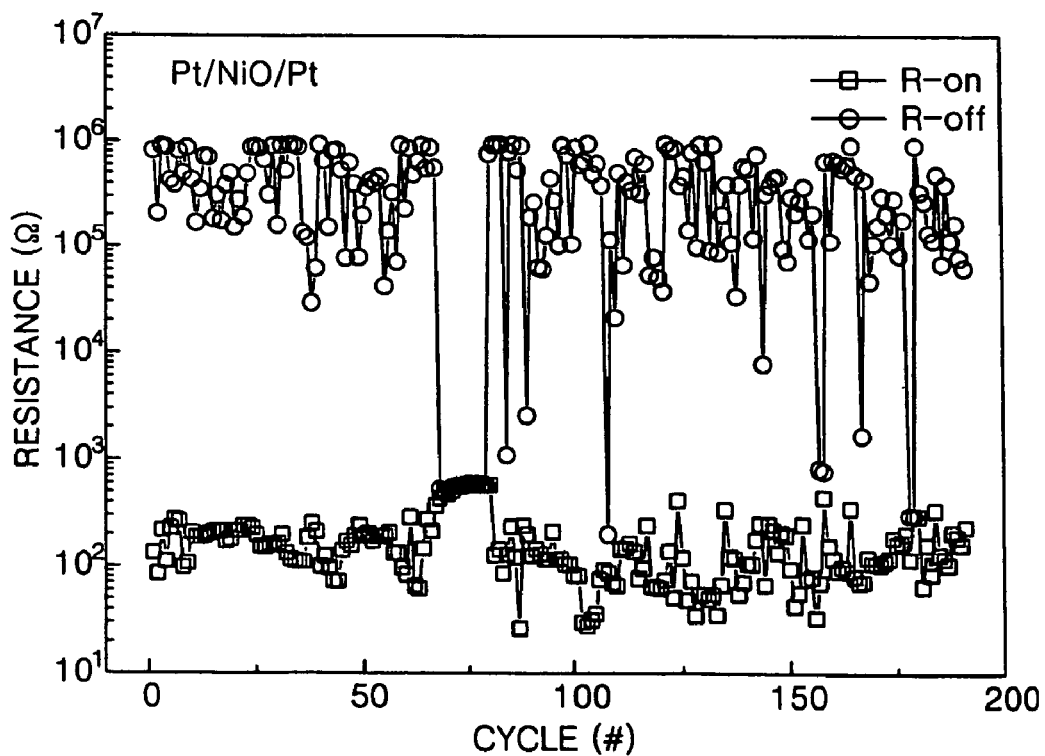
FIG. 3B is a graph illustrating a distribution of resistance values of the storage node depending on an ON or OFF state.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 4:
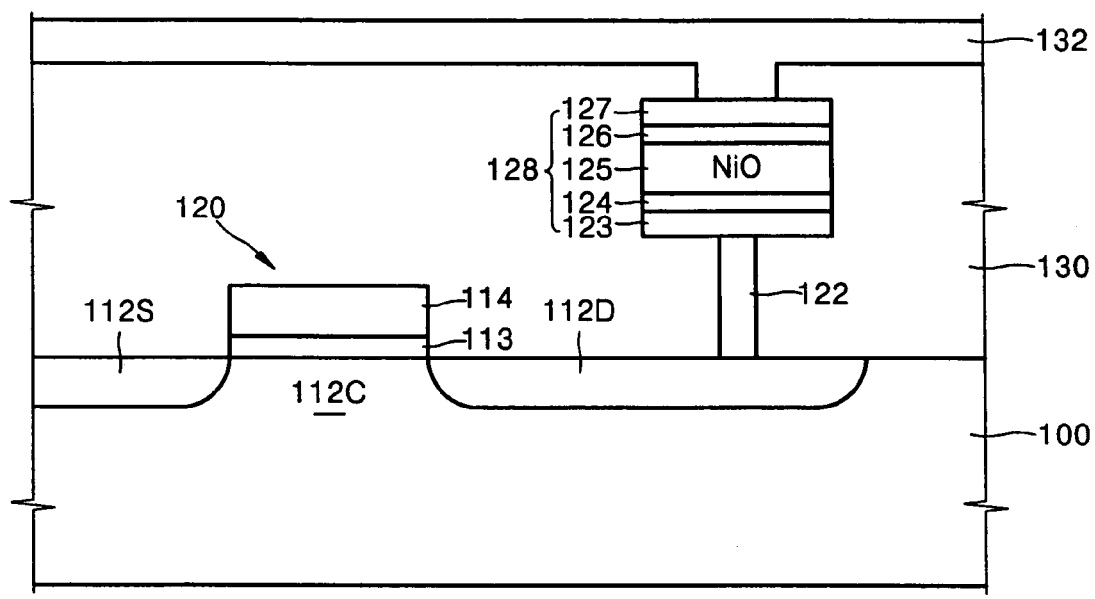
FIG. 4 is a cross-sectional view illustrating a non-volatile memory device according to an example embodiment of the present invention.
Figure 5:
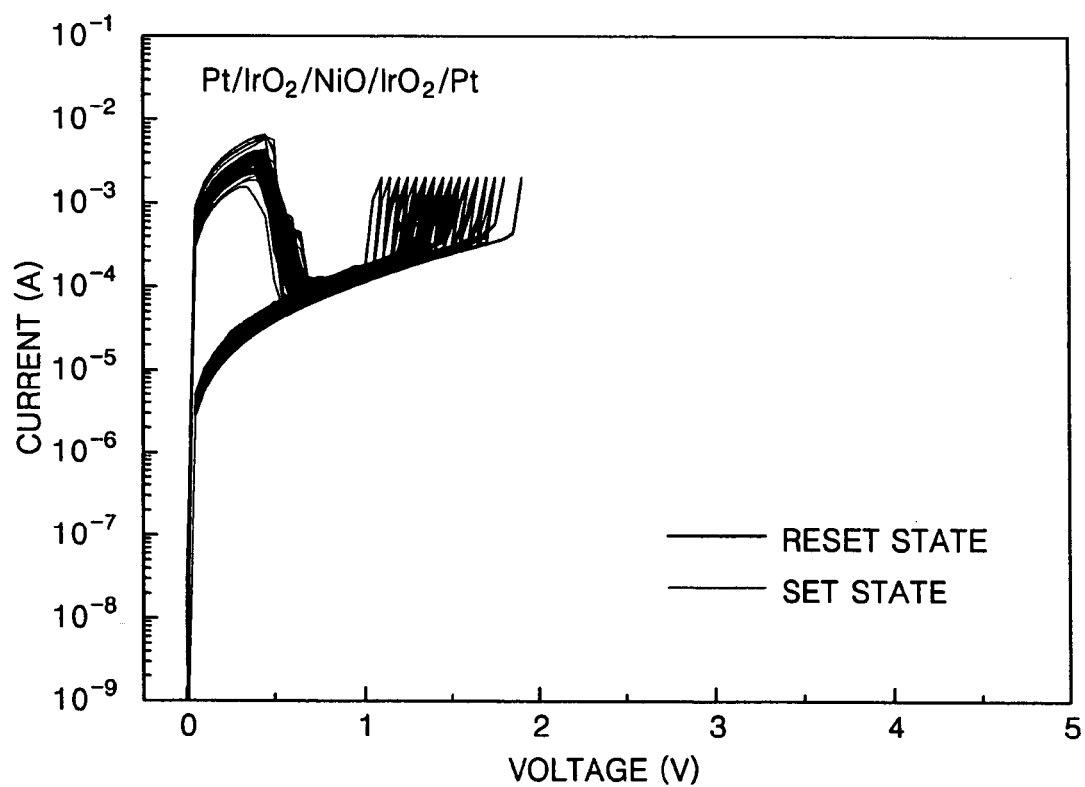
FIG. 5 is a graph exhibiting a switching characteristic of a storage node illustrated in FIG. 4.

FIG. 4 is a cross-sectional view illustrating a non-volatile memory device according to an example embodiment of the present invention. FIG. 5 is a graph illustrating a switching characteristic of a storage node illustrated in FIG. 4.

With reference to FIGS. 4 and 5, the non-volatile memory device may include a transistor 120 and/or a storage node 128. The transistor 120 may be a switching device, and the storage node 128 may be coupled to the transistor 120. An insulation layer 130 may be disposed between the storage node 128 and the transistor 120. A conductive contact plug 122 may couple the storage node 128 with the transistor 120. A plate electrode 132 may be disposed over the storage node 128 and coupled with the storage node 128. The transistor 120 may include a source 112S, a drain 112D, a channel 112C, an insulating layer 113 and/or a gate electrode 114. Because a structure of the transistor 120 and a fabrication method thereof are well known in the art, detailed description thereof will be omitted. Although example embodiments of the present invention are described herein with regard the transistor 120, other switching devices (e.g., diodes, etc.) may be used. A diode structure and a fabrication method thereof are also well known in the art and a detailed description thereof will be omitted.

The storage node 128 may include a first electrode 123, a second electrode 127, a data storage layer 125, a first contact layer 124 and a second contact layer 126. The data storage layer 125 may be disposed between the first electrode 123 and the second electrode 127. The first and second contact layers 124 and 126 may be disposed at least beneath or above the data storage layer 125.

The data storage layer 125 may transition to a reset state or a set state based on (or depending on) a voltage level applied to the data storage layer 125 (e.g., see FIG. 5). Because the data storage layer 125 has different resistance values for each state, binary information may be stored and read based on a difference between the resistance values. The data storage layer 125 may include a transition metal oxide, aluminum oxide or the like. The transition metal oxide may be an oxide of a metal selected from, for example, nickel (Ni), niobium (Nb), titanium (Ti), zirconium (Zr), hafnium (Hf), cobalt (Co), iron (Fe), copper (Cu), chrome (Cr), a combination thereof or the like. The first electrode 123 and the second electrode 127 may include, for example, one of iridium (Ir), platinum (Pt), ruthenium (Ru), tungsten (W), titanium nitride (TiN), polysilicon, a combination thereof or the like.

The first and second contact layers 124 and 126 may include a conductive metal oxide. Because the first and second contact layers 124 and 126 are formed at least beneath or above the data storage layer 125, the first and second contact layers 124 and 126 may improve interfacial characteristics between the data storage layer 125 and the lower electrode 123 and/or between the upper electrode 127 and the data storage layer 125. The conductive metal oxide may be $IrO_2$, $RuO_2$, $SrRuO_3$, $MoO_2$, $OsO_2$, $ReO_2$, $RhO_2$, $WO_2$, indium tin oxide (ITO), a combination thereof or the like. The first and second contact layers 124 and 126 may have a thickness ranging from approximately 10 Å to approximately 500 Å, inclusive.

Compared with the conventional M-I-M memory cell structure, the storage node 128 of the non-volatile memory device, according to at least some example embodiments of the present embodiment, may have, for example, an M-B-I-B-M, M-B-I-M or M-I-B-M memory cell structure. 'M' represents the first electrode 123 and the second electrode 127 both including a metal or conductive material. 'I' and 'B' represent the data storage layer 125 and the first and second contact layers 124 and 126, respectively.

Conventional resistance material based memory devices with the M-I-M memory cell structure may be limited in that set and reset voltage values $V_{set}$ and $V_{reset}$ applied to the storage node during repetitive switchings may be distributed with a larger deviation. In addition, resistance values $R_{ON}$ and $R_{OFF}$ for the storage node depending on an ON or OFF state may not be distributed uniformly. According to example embodiments of the present embodiment, however, these limitations may be improved, for example, by improving the interfacial characteristics between the data storage layer 125 and the first electrode 123 and/or between the data storage layer 125 and the upper electrode 127. For example, in the case of repetitive switching, resistance values of the storage node 128 may be distributed with a decreased level of deviation due to the improved interfacial characteristics as compared with the conventional resistance material based memory device. As a result, the storage node 128 may have more stable memory switching characteristics.

FIGS. 6A through 7B illustrate an improved memory switching characteristic in the non-volatile memory device according to an example embodiment of the present invention.

Figure 6A:
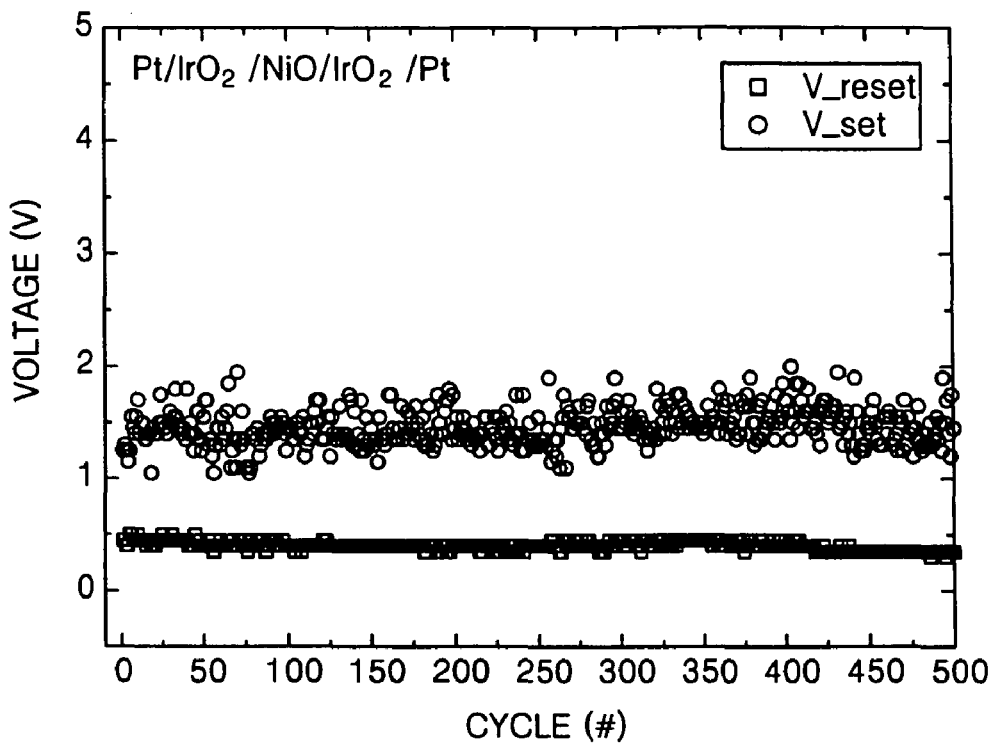
FIG. 6A is a graph illustrating a distribution of set and reset voltage values applied to the storage node illustrated in FIG. 4.
Figure 6B:
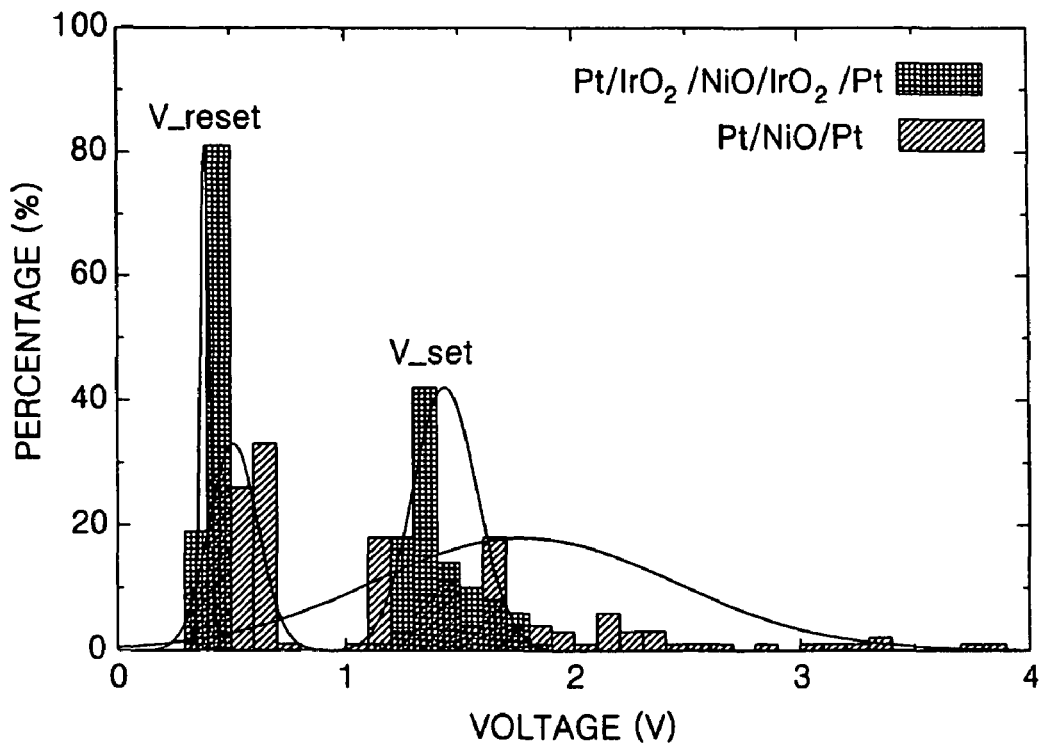
FIG. 6B is a histogram of the set and reset voltage values illustrated in FIG. 6A.
Figure 7A:
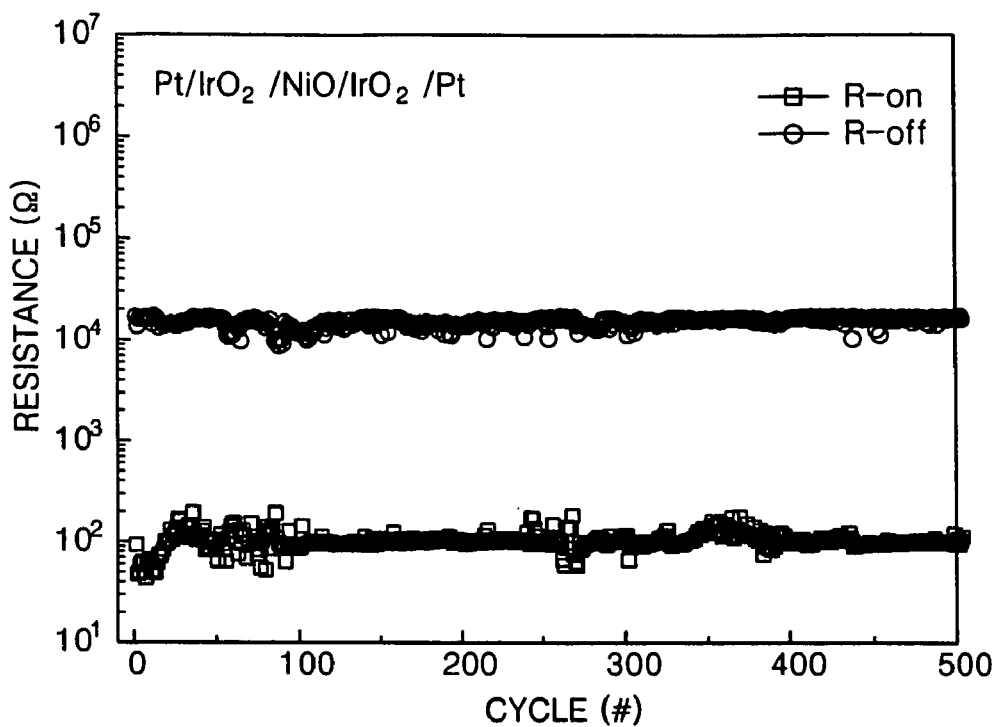
FIG. 7A is a graph illustrating a distribution of resistance values of the storage node depending on an on or off state.
Figure 7B:
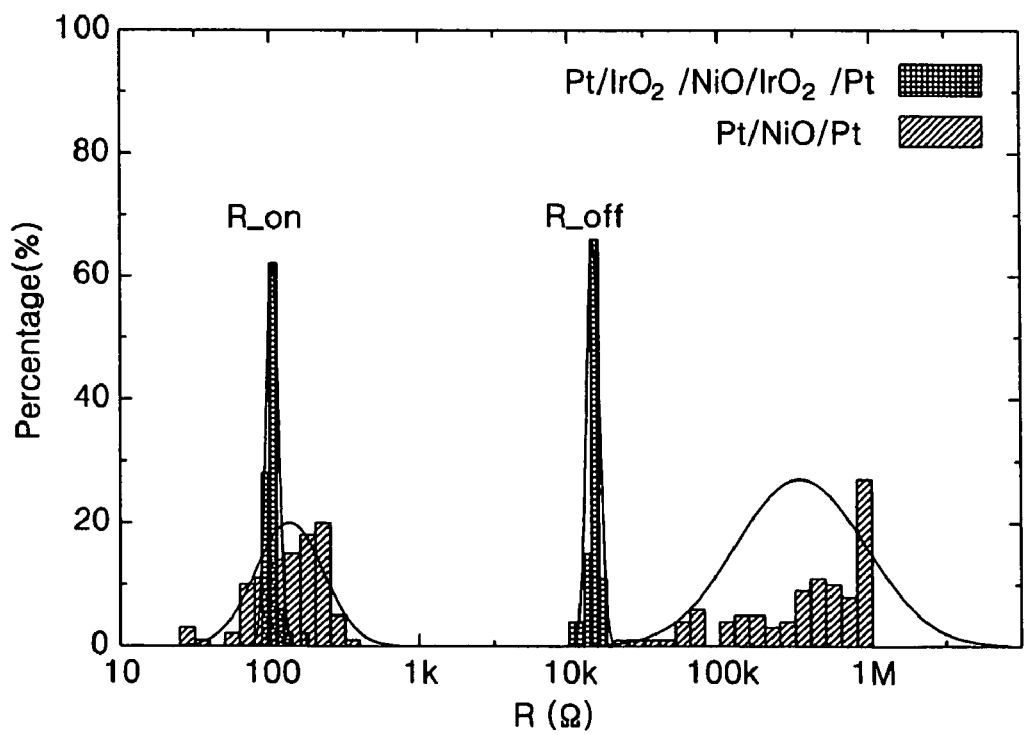
FIG. 7B is a histogram of the resistance values of the storage node illustrated in FIG. 7A.

FIG. 6A is a graph illustrating an example distribution of set and reset voltage values applied to the storage node illustrated in FIG. 4. FIG. 6B is a histogram of the set and reset voltage values illustrated in FIG. 6A. FIG. 7A is a graph illustrating an example distribution of resistance values of the storage node depending on an on or off state, and FIG. 7B is a histogram of the resistance values of the storage node illustrated in FIG. 7A.

With reference to FIGS. 6A and 6B, an example distribution of set and reset voltage values $V_{set}$ and $V_{reset}$ with respect to a switching cycle will be discussed. The storage node 128 according to at least some example embodiments of the present invention may have set and reset voltage values $V_{set}$ and $V_{reset}$ with decreased standard deviations. Table 1 below shows data obtained from measuring set and reset voltage values $V_{set}$ and $V_{reset}$ of the conventional M-I-M memory cell structure and the M-B-I-B-M memory cell structure, according to an example embodiment of the present invention, and comparing average values, standard deviation values, maximum values and minimum values of the measured set voltage values $V_{set}$ and the reset voltage values $V_{reset}$. Herein, the set voltage values $V_{set}$ and the reset voltage values $V_{reset}$ are measured in voltages.

TABLE 1

| | $V_{set}$ Average (Standard Deviation) | $V_{set}$ Maximum/ minimum | $V_{reset}$ Average (Standard Deviation) | $V_{reset}$ Maximum/ minimum |
| --- | --- | --- | --- | --- |
| Pt/NiO/Pt | 1.78 (0.66) | 4.55/1.00 | 0.51 (0.11) | 0.75/0.35 |
| Pt/IrO$_2$/NiO/ IrO$_2$/Pt (IrO$_2$: 100 Å) | 1.44 (0.14) | 1.80/1.15 | 0.39 (0.02) | 0.40/0.35 |

With reference to FIGS. 7A and 7B, an example distribution of resistance values $R_{ON}$ and $R_{OFF}$ of the storage node 128 with respect to a switching cycle will be discussed. The storage node 128 according to example embodiments of the present invention may have resistance values $R_{ON}$ and $R_{OFF}$ with decreased standard deviations. Table 2 below exhibits data obtained from measuring resistance values $R_{ON}$ and $R_{OFF}$ of the conventional M-I-M memory cell structure and an M-B-I-B-M memory cell structure according to an example embodiment of the present invention, and comparing average values, standard deviation values, maximum values and minimum values of the measured resistance values $R_{ON}$ and $R_{OFF}$. Herein, the resistance values $R_{ON}$ and $R_{OFF}$ are measured in Ohms.

TABLE 2

|  | $R_{ON}$ Average (Standard Deviation) | $R_{ON}$ Maximum/ minimum | $R_{OFF}$ Average (Standard Deviation) | $R_{OFF}$ Maximum/ minimum |
| --- | --- | --- | --- | --- |
| Pt/NiO/Pt | 151 (66) | 367/28 | 481k (311k) | 951k/21k |
| Pt/IrO$_2$/NiO/ IrO$_2$/Pt (IrO$_2$: 100 Å) | 105 (12) | 172/94 | 14.6k (1.3k) | 16.6k/10.3k |

Table 3 below shows data for an example structure of the storage node used in measuring the set and reset voltage values $V_{set}$ and $V_{reset}$, the resistance values $R_{ON}$ and $R_{OFF}$ and various sputtering deposition conditions for depositing an IrO$_2$ contact layer.

TABLE 3

| Sample | Structure | NiO thickness | IrO$_2$ thickness | Sputter process |
| --- | --- | --- | --- | --- |
| 1. | Pt/NiO/pt | 500 Å |  | Reference sample |
| 2. | Pt/IrO$_2$/NiO/Pt | 500 Å | 30 Å | 310° C., 300 W, 15 sec. |
| 3. | Pt/IrO$_2$/NiO/Pt | 500 Å | 100 Å | 310° C., 300 W, 5 sec. |
| 4. | Pt/IrO$_2$/NiO/IrO$_2$/Pt | 500 Å | 100 Å | 310° C., 300 W, 15 sec. |
| 6. | Pt/IrO$_2$/NiO/IrO$_2$/Pt | 500 Å | 200 Å | 310° C., 300 W, 30 sec. |
| 7. | Pt/IrO$_2$/NiO/IrO$_2$/Pt | 500 Å | 500 Å | 310° C., 300 W, 70 sec. |

FIGS. 8A through 8E are cross-sectional views illustrating a method of fabricating a non-volatile memory device according to an example embodiment of the present invention. According to at least some example embodiments of the present invention, a typical vacuum deposition method such as a chemical vapor deposition (CVD) method, a physical vapor deposition (PVD) method or the like may be used to deposit target layers. The PVD method may include, for example, a sputtering method. The non-volatile memory device according to at least one example embodiment of the present invention may include a transistor 120 and a storage node 128. The transistor 120 may serve as a switching device, and although example embodiments of the present invention are described with regard to transistor 120, any suitable switching device may be used. The storage node 128 may be coupled to the transistor 120. Because a diode structure and a fabrication method thereof are well known in the art, a detailed description thereof will be omitted for the sake of brevity.

Figure 8A:
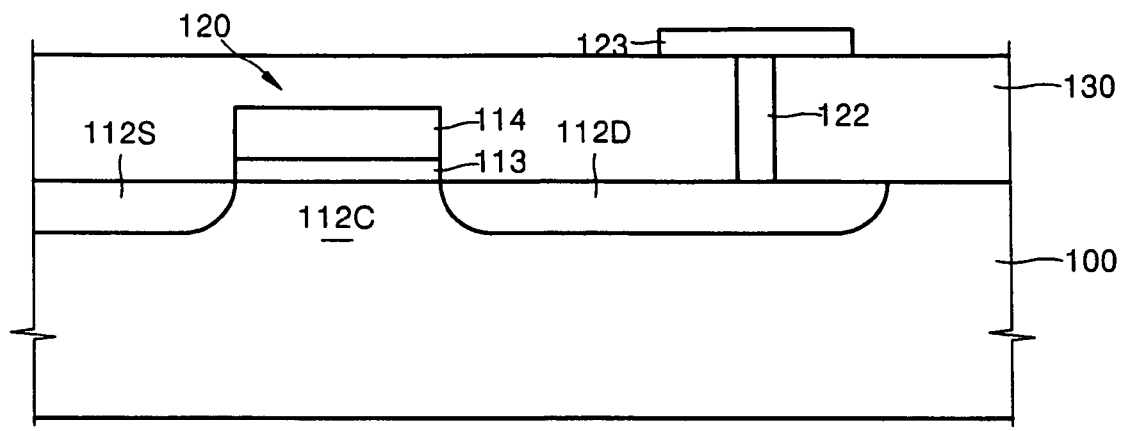
FIGS. 8A through 8E are cross-sectional views illustrating a method of fabricating a non-volatile memory device according to an example embodiment of the present invention.

Referring to FIG. 8A, the transistor 120 may include a source 112S, a drain 112D, a channel 112C, an insulating layer 113 and/or a gate electrode 114. An insulation layer 130 may be formed over the transistor 120. Because a structure of the transistor 120 and a fabrication method thereof are well known in the art, a detailed description thereof will be omitted for the sake of brevity.

A contact hole may be formed in the insulation layer 130. The contact hole may exposes the source 112S or the drain 112D. A conductive material may fill the contact hole to form a contact plug 122. A first electrode 123 may be formed over a portion of the insulation layer 130 such that the first electrode 123 contacts the contact plug 122. The first electrode 123 may include, for example, one of Ir, Pt, Ru, W, TiN, polysilicon, a combination thereof or the like.

Figure 8B:
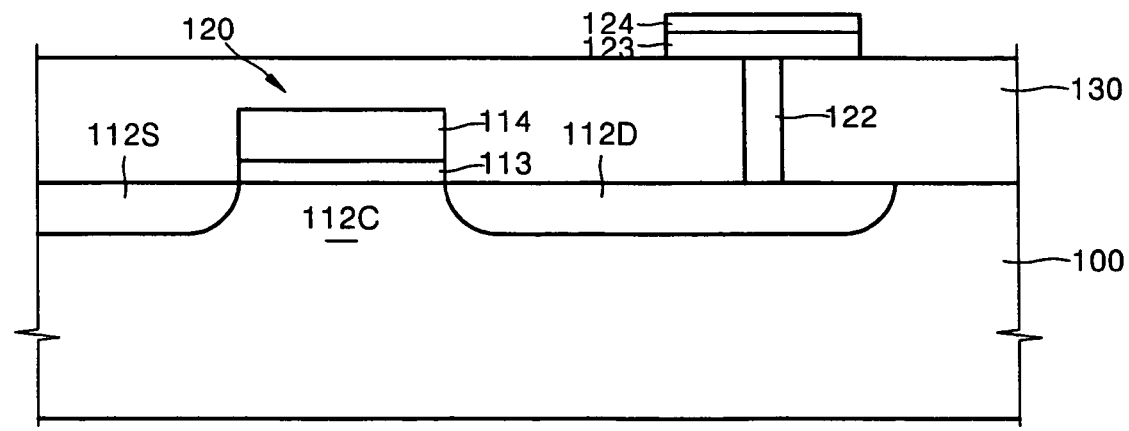

Referring to FIG. 8B, a first contact layer 124 may be formed over the first electrode 123. The first contact layer 124 may include a conductive metal oxide, for example, one of IrO$_2$, RuO$_2$, SrRuO$_3$, MoO$_2$, OsO$_2$, ReO$_2$, RhO$_2$, WO$_2$, ITO, a combination thereof or the like. The first contact layer 124 may have a thickness of approximately 10 Å to approximately 500 Å, inclusive.

Figure 8C:
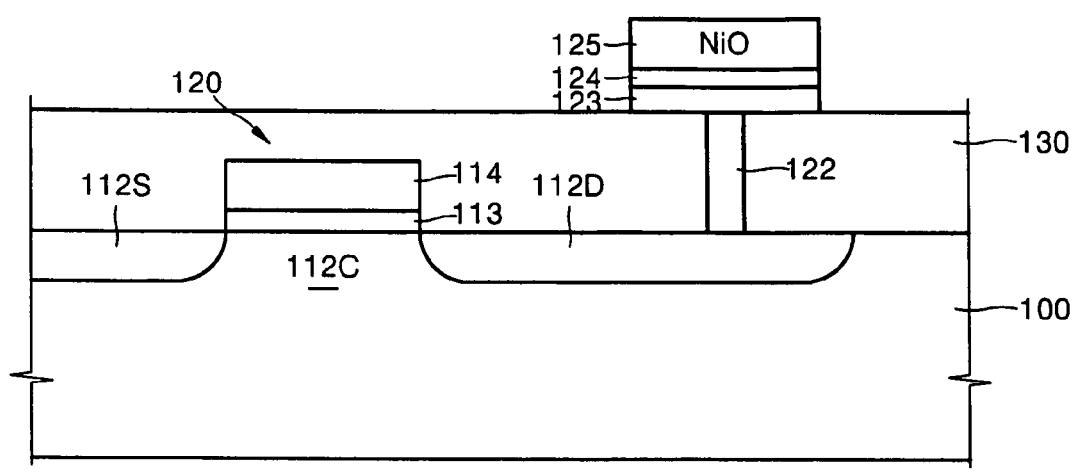
Figure 8D:
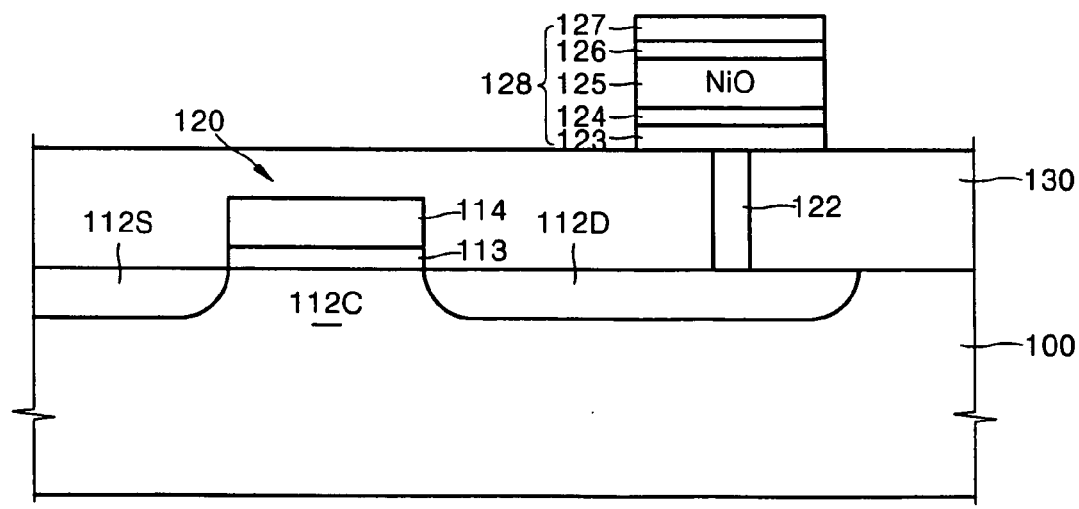

Referring to FIGS. 8C to 8D, a data storage layer 125 may be formed over the first contact layer 124. The data storage layer 125 may include a transition metal oxide, aluminum oxide, a combination thereof or the like. The transition metal oxide may be an oxide of a metal, for example, one of Ni, Nb, Ti, Zr, Hf, Co, Fe, Cu, Cr, a combination thereof or the like. A second contact layer 126 may be formed over the data storage layer 125. The second contact layer 126 may include a transition metal oxide, for example, one of IrO$_2$, RuO$_2$, SrRuO$_3$, MoO$_2$, OsO$_2$, ReO$_2$, RhO$_2$, WO$_2$, ITO, a combination thereof or the like. The second contact layer 126 may have a thickness of approximately 10 Å to approximately 500 Å, inclusive. A second electrode 127 may be formed over the second contact layer 126. The second electrode 127 may be, for example, Ir, Pt, Ru, W, TiN, polysilicon, a combination thereof or the like.

Figure 8E:
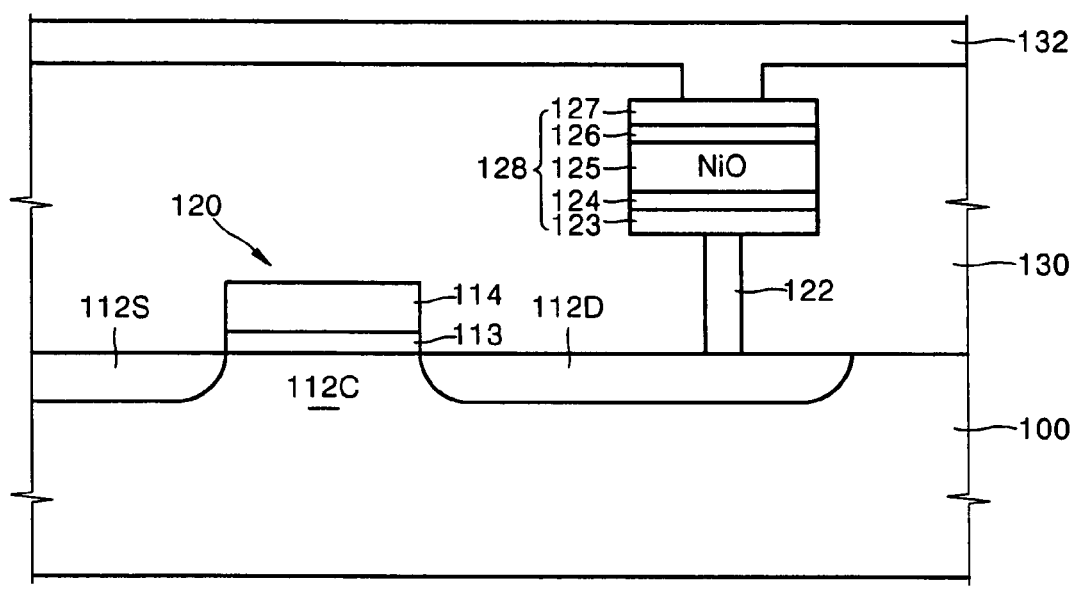

Referring to FIG. 8E, another insulation layer 130 may be formed over the above resultant structure (e.g., see FIG. 8D), for example, until the insulation layer 130 covers or substantially covers (e.g., buries) the storage node 128. Another contact hole, which may expose the second electrode 127, may be formed in the insulation layer 130, and a plate electrode 132 may be formed over the insulation layer 130 and in the other contact hole. Using the processes, according to example embodiments of the present invention, a non-volatile memory device having more stable memory switching characteristics in the storage node may be fabricated. Although the storage node 128 according to example embodiments of the present embodiment are described as including the first contact layer 124 and the second contact layer 126, the storage node 128 according to example embodiments of the present invention may include one of the first contact layer 124 and the second contact layer 126.

According to the example embodiments of the present invention, the non-volatile memory device may have more stable memory switching characteristics in the storage node. Using the contact layer formed of a conductive metal oxide such as IrO$_2$ may improve the interfacial characteristics between the data storage layer and the first electrode and between the data storage layer and the second electrode. As compared with the conventional non-volatile memory device, the improved interfacial characteristics may decrease a deviation in resistance values of the storage node depending on an ON or OFF state, and/or a deviation of set and reset voltage values applied to the storage node. As a result, more stable memory switching characteristics may be obtained.

In example embodiments, the data storage layer may be made of a transition metal oxide having multiple resistance states, as described above. For example, the data storage layer may be made of at least one material selected from the group consisting of NiO, TiO$_2$, HfO, Nb$_2$O$_5$, ZnO, WO$_3$, and CoO or GST (Ge$_2$Sb$_2$Te$_5$) or PCMO(Pr$_x$Ca$_{1-x}$MnO$_3$). The data storage layer film may be a chemical compound including one or more elements selected from the group consisting of S, Se, Te, As, Sb, Ge, Sn, In and Ag.

In some example embodiments, the data storage layer may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te).

Alternatively, the data storage layer may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the data storage layer may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the data storage layer is described above as being formed primarily of ternary phase-change chalcogenide alloys, the chalcogenide alloy of the data storage layer could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A resistive memory device, comprising:
   a switching device; and
   a storage node coupled with the switching device, the storage node including,
      a first electrode,
      a second electrode,
      a data storage layer including at least a transition metal oxide or aluminum oxide disposed between the first electrode and the second electrode, and
      at least one contact layer, formed of a conductive metal oxide, disposed at least one of between the data storage layer and the first electrode and between the data storage layer and the second electrode,
      wherein the data storage layer is a variable resistive layer of which resistance changes according to a voltage applied thereto.

2. The resistive memory device of claim 1, wherein the conductive metal oxide is one of $IrO_2$, $RuO_2$, $SrRuO_3$, $MoO_2$, $OsO_2$, $ReO_2$, $RhO_2$, $WO_2$, ITO (indium tin oxide) or a combination thereof.

3. The resistive memory device of claim 1, wherein the at least one contact layer has a thickness ranging from approximately 10 Å to approximately 500 Å, inclusive.

4. The resistive memory device of claim 1, wherein the transition metal oxide is an oxide of a metal, the metal including one of Ni, Nb, Ti, Zr, Hf, Co, Fe, Cu, Cr or a combination thereof.

5. The resistive memory device of claim 1, wherein each of the first electrode and the second electrode is formed of a material including one of Ir, Pt, Ru, W, TiN, polysilicon or a combination thereof.

6. The resistive memory device of claim 1, wherein the switching device includes a transistor or a diode.

7. The resistive memory device of claim 1, wherein the at least one contact layer is formed only between the data storage layer and the first electrode.

8. The resistive memory device of claim 1, wherein the at least one contact layer is formed only between the data storage layer and the second electrode.

9. The resistive memory device of claim 1, wherein the at least one contact layer includes a first and a second contact layer, the first contact layer being arranged between the first electrode and the data storage layer, and the second contact layer being arranged between the data storage layer and the second electrode.

10. A method of fabricating a resistive memory device, the method comprising:
    preparing a switching device;
    forming a first electrode coupled with the switching device;
    forming a first contact layer on the first electrode, the first contact layer including a conductive metal oxide;
    forming a data storage layer on the first contact layer, the data storage layer including a transition metal oxide or aluminum oxide; and
    forming a second electrode on the data storage layer,
    wherein the data storage layer is a variable resistive layer of which resistance changes according to a voltage applied thereto.

11. The method of claim 10, wherein the conductive metal oxide is one of $IrO_2$, $RuO_2$, $SrRuO_3$, $MoO_2$, $OsO_2$, $RhO_2$, $RhO_2$, $WO_2$, ITO (indium tin oxide) or a combination thereof.

12. The method of claim 10, wherein the first contact layer is formed to a thickness ranging from approximately 10 Å to approximately 500 Å, inclusive.

13. The method of claim 10, wherein the transition metal includes one of Ni, Nb, Ti, Zr, Hf, Co, Fe, Cu, Cr or a combination thereof.

14. The method of claim 10, wherein each of the first electrode and the second electrode is formed of a material including one of Ir, Pt, Ru, W, TiN, polysilicon or a combination thereof.

15. The method of claim 10, wherein the switching device includes a transistor or a diode.

16. The method of claim 10, further including, forming a second contact layer on the data storage layer using a conductive metal oxide after the data storage layer is formed, and before the forming of the second electrode.

17. The method of claim 16, wherein the conductive metal oxides used to form the first and second contact layers include one of $IrO_2$, $RuO_2$, $SrRuO_3$, $MoO_2$, $OsO_2$, $ReO_2$, $RhO_2$, $WO_2$, ITO or a combination thereof.

18. The method of claim 16, wherein each of the first contact layer and the second contact layer is formed to a thickness ranging from approximately 10 Å to approximately 500 Å, inclusive.

19. The method of claim 16, wherein the transition metal oxide includes one of Ni, Nb, Ti, Zr, Hf, Co, Fe, Cu, Cr or a combination thereof.

20. The method of claim 16, wherein each of the first contact layer and the second contact layer is formed to a thickness ranging from approximately 10 Å to approximately 500 Å, inclusive.

21. A method of fabricating a resistive memory device, the method comprising:
    preparing a switching device;
    forming a first electrode coupled with the switching device;
    forming a data storage layer on the first electrode, the data storage layer including a transition metal oxide or aluminum oxide;

forming a contact layer on the data storage layer, the contact layer including a conductive metal oxide; and forming a second electrode on the contact layer, wherein the data storage layer is a variable resistive layer of which resistance changes according to a voltage applied thereto.

22. The method of claim 21, wherein the conductive metal oxide includes one of $IrO_2$, $RuO_2$, $SrRuO_3$, $MoO_2$, $OsO_2$, $ReO_2$, $RhO_2$, $WO_2$, ITO (indium tin oxide) or a combination thereof.

23. The method of claim 21, wherein the contact layer is formed to a thickness ranging from approximately 10 Å to approximately 500 Å, inclusive.

24. The method of claim 21, wherein the transition metal oxide includes one of Ni, Nb, Ti, Zr, Hf, Co, Fe, Cu, Cr or a combination thereof.

25. The method of claim 21, wherein each of the first electrode and the second electrode is formed of a material including one of Ir, Pt, Ru, W, TiN, polysilicon or a combination thereof.

26. The method of claim 21, wherein the switching device comprises a transistor or a diode.

* * * * *